(12) United States Patent
Weng

(10) Patent No.: US 8,013,643 B2
(45) Date of Patent: Sep. 6, 2011

(54) SOURCE DRIVER

(75) Inventor: Meng-Tse Weng, Tainan County (TW)

(73) Assignee: Himax Technologies Limited, Tainan (TW)

( * ) Notice: Subject to any disclaimer, the term of this patent is extended or adjusted under 35 U.S.C. 154(b) by 0 days.

(21) Appl. No.: 12/687,341

(22) Filed: Jan. 14, 2010

(65) Prior Publication Data

US 2011/0169544 A1 Jul. 14, 2011

(51) Int. Cl.
*H03B 1/00* (2006.01)
*H03K 3/00* (2006.01)
(52) U.S. Cl. ........ 327/108; 327/109; 327/110; 327/111; 327/112; 345/211
(58) Field of Classification Search .................. 327/108; 345/211
See application file for complete search history.

(56) References Cited

U.S. PATENT DOCUMENTS

2005/0231497 A1* 10/2005 Harada ........................ 345/204
2008/0150779 A1* 6/2008 Sung ............................. 341/145
2010/0321362 A1* 12/2010 Weng ............................ 345/211

* cited by examiner

*Primary Examiner* — Lincoln Donovan
*Assistant Examiner* — John W Poos
(74) *Attorney, Agent, or Firm* — J.C. Patents

(57) ABSTRACT

A source driver, which has a first resistor string, a first digital-to-analog converter, and a channel buffer, is provided. The first resistor string has a plurality of resistors connected in series, wherein each of the resistors of the first resistor string provides a corresponding gamma voltage. The first digital-to-analog converter is coupled to the resistors of the first resistor string. The digital-to-analog converter selectively outputs one of gamma voltages provided by the resistors as a first output voltage according to a data code. The channel buffer is coupled to an output terminal of the first digital-to-analog converter to output a second output voltage by shifting a voltage level of the first output voltage.

14 Claims, 3 Drawing Sheets

SOURCE DRIVER

BACKGROUND OF THE INVENTION

1. Field of the Invention

The invention relates to a source driver, and more particularly to a source driver capable of shifting voltage levels of driving voltages.

2. Description of Related Art

In current information era, the information broadcasting media and all kinds of electronic displays have been widely applied to the industry apparatus or the home version apparatus, and thus, the electronic displays have become more and more important. These electronic displays are also continuously developed to satisfy all kinds of requirements in the information society.

Generally, the electronic displays display and transmit all kinds of information to the user who uses it. That is, these electronic displays convert electric information signals to optical information signals which can be visually recognized by the user.

In current display apparatus or system, such as the cathode-ray tube (CRT) or the liquid crystal display (LCD), the relationship between the input voltage and the display output is not a linear one, and the relationship therebetween is described through the gamma curve. For the LCD, through the gamma curve, the output voltages (i.e. the gamma voltages) corresponding to each gray level can be found. By using these gamma voltages to control the LCD panel to display exact gray levels, the LCD can display an exact image.

In order to improve the display effect of the LCD, one pixel in the LCD panel is divided into two sub-pixels. Due to the configuration of the circuit, the voltage levels of the common voltages of the two sub-pixels may be different. In this case, by using the same gamma voltage to control the LCD panel, the two sub-pixels may display the different effects, thereby affecting display quality. Accordingly, if the different sub-pixels displaying the same effect is required, the voltage levels of the outputted gamma voltages may be different. That is, when some pixels display the same effect, receiving a shifted gamma voltage is required.

FIG. 1 is a circuit diagram of a conventional source driver. Referring to FIG. 1, in the source driver 100, the channel buffer 110 is used to shift the reference voltage GMAH by an offset voltage ΔV, and output it after that, wherein the channel buffer 110 is configured by an operational amplifier and a plurality resistors R, of which the function is similar to that of a subtractor. Similarly, the channel buffer 120 is used to shift the reference voltage GMAL by an offset voltage ΔV, wherein the channel buffer 120 is configured by an operational amplifier and a plurality resistors R, of which the function is similar to that of a subtractor. After being applied with the shifted reference voltages GMAH and GMAL, the resistors AR1-AR64 divide them to output the shifted gamma voltages AV0-AV63. The digital-to-analog converter 130 selectively outputs one of the gamma voltages AV0-AV63 as the driving voltages.

However, the conventional source driver is required simultaneously shifting the reference voltages GMAH and GMAL. That is, the channel buffers 110 and 120 need to work simultaneously so as to synchronize the voltage levels of the gamma voltages AV0-AV63. In addition, duce to the phenomenon of OP (operational amplifier) deviation of the channel buffers 110 and 120, the voltage drop between the output voltage of the channel buffer 110 and the reference voltage GMAH may be not equal to the offset voltage ΔV, and the voltage drop between the output voltage voltage of the channel buffer 120 and the reference voltage GMAL may be not equal to the offset voltage ΔV. Therefore, the voltage levels of the gamma voltages AV0-AV63 may not shifted equally.

SUMMARY OF THE INVENTION

An embodiment of the invention provides a source driver capable of shifting voltage levels of driving voltages.

An embodiment of the invention provides a source driver including a first resistor string, a first digital-to-analog converter, and a channel buffer. a first resistor string includes a plurality of resistors connected in series, and each of the resistors of the first resistor string provides a corresponding gamma voltage. The first digital-to-analog converter is coupled to the resistors of the first resistor string. The first digital-to-analog converter outputs one of gamma voltages provided by the resistors as a first output voltage according to a data code The channel buffer is coupled to an output terminal of the first digital-to-analog converter to shift a voltage level of the first output voltage and output a second output voltage.

In an embodiment of the invention, the channel buffer shifts the voltage level of the first output voltage by an offset voltage.

In an embodiment of the invention, the channel buffer includes an operational amplifier, a first resistor, a second resistor, a third resistor, and a fourth resistor. The operational amplifier outputs the second output voltage. One end of the first resistor is applied with the offset voltage, and the other one of the first resistor is coupled to a negative input terminal of the operational amplifier. One end of the second resistor is coupled to the negative input end of the operational amplifier, and the other one of the second resistor is coupled to an output terminal of the operational amplifier. One end of the third resistor is coupled to the output terminal of the first digital-to-analog converter, and the other one of the third resistor is coupled to a positive input terminal of the operational amplifier. One end of the fourth resistor is coupled to the positive input terminal of the operational amplifier, and the other one of the fourth resistor is applied with a reference voltage.

In an embodiment of the invention, the resistances of the first resistor, the second resistor, the third resistor, and the fourth resistor are identical.

In an embodiment of the invention, the source driver further includes a second digital-to-analog converter for outputting the offset voltage according to a control code.

In an embodiment of the invention, the second digital-to-analog converter includes a second resistor string and a plurality of switches. The second resistor string includes a plurality of resistors connected in series, and each of the resistors of the second resistor string provides a corresponding divided voltage. The switches selects one of the divided voltage as the offset voltage according to the control code.

In an embodiment of the invention, a first end of the second resistor string is applied with a first input voltage, and a second end of the second resistor string is applied with a second input voltage, wherein the first input voltage is greater than the second input voltage.

In an embodiment of the invention, a first end of the first resistor string is applied with a first reference voltage, and a second end of the first resistor string is applied with a second reference voltage, wherein the first reference voltage is greater than the second reference voltage.

In an embodiment of the invention, the source driver further includes a current digital-to-analog converter, wherein the current digital-to-analog converter outputs an offset current according to a control code. Moreover, the channel buffer includes an operational amplifier and a resistor. The operational amplifier outputs the second output voltage, wherein a positive input terminal of the operational amplifier is coupled to the output terminal of the first digital-to-analog converter. One end of the resistor is coupled to a negative input terminal of the operational amplifier and receives the offset current, and the other one of the resistor is coupled to an output terminal of the operational amplifier and outputs the second output voltage.

In an embodiment of the invention, the source driver further includes a voltage-to-current converter, wherein the voltage-to-current converter converts a reference voltage into a reference current, and the current digital-to-analog converter outputs the offset current based on the reference current.

In an embodiment of the invention, the voltage-to-current converter is a resistor.

In an embodiment of the invention, the second output voltage is less than the first output voltage.

In an embodiment of the invention, the second output voltage is greater than the first output voltage.

Based on the above, the source driver in the embodiment of the invention can select the size of the offset voltage according to the control code, and shift the voltage level of the second output voltage according to the offset voltage to adjust the display effect of the liquid crystal. Moreover, the source driver in the embodiment of the invention can generate the offset current according to the control code, and shift the voltage level of the second output voltage according to the offset current to adjust the display effect of the liquid crystal. Accordingly, through the shift of the second output voltage, the pixels having different common voltages can display the similar or the same effect.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1:
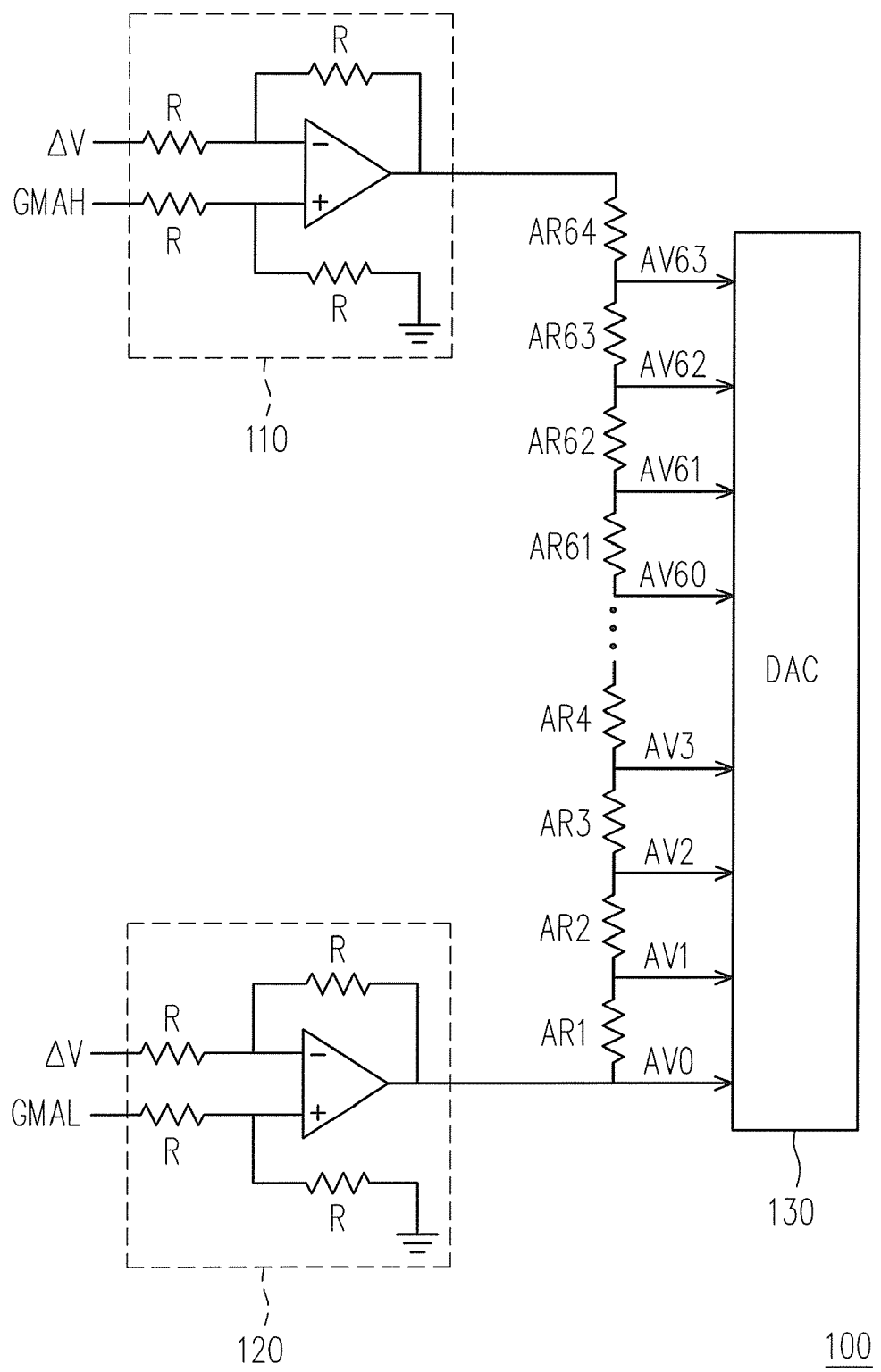
FIG. 1 is a circuit diagram of a conventional source driver.
Figure 2:
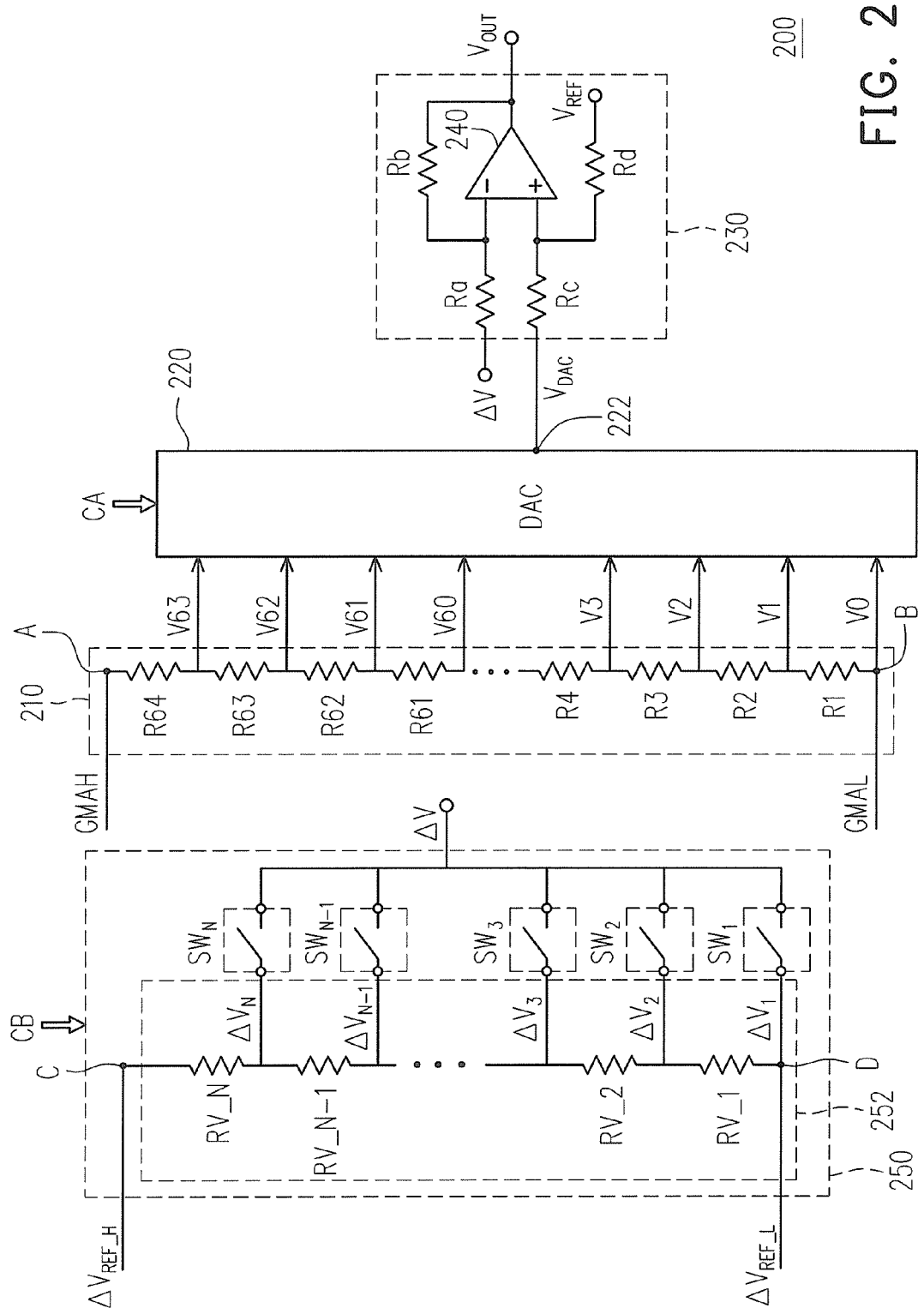
FIG. 2 is a circuit diagram of a source driver according to the first embodiment of the invention.

FIG. 2 is a circuit diagram of a source driver according to the first embodiment of the invention. Referring to FIG. 2, the gamma voltage generation 200 circuit includes a first resistor string 210, a first digital-to-analog converter 220, a channel buffer 230, and a second digital-to-analog converter 250. The first resistor string 210 includes a plurality of resistors R1-R64 connected in series. The first end A of the first resistor string 210 is applied with a first reference voltage GMAH, and the second end B of the first resistor string 210 is applied with a second reference voltage GMAL, wherein the first reference voltage GMAH is greater than the second reference voltage GMAL. The resistors R1-R64 divide the voltage between the first reference voltage GMAH and the second reference voltage GMAL to provide a plurality of divided voltages as gamma voltages V0-V63.

The first digital-to-analog converter 220 is coupled to the resistors R1-R64 of the first resistor string 210. The first digital-to-analog converter 220 outputs one of the gamma voltages R1-R64 as a first output voltage $V_{DAC}$ according to a data code CA, and the first output voltage $V_{DAC}$ is not the driving voltage. The channel buffer 230 is coupled to an output terminal 222 of the first digital-to-analog converter 220. The channel buffer 230 includes an operational amplifier 240 and resistors Ra, Rb, Rc, and Rd. One end of the first resistor Ra is applied with the offset voltage $\Delta V$, and the other one of the first resistor Ra is coupled to a negative input terminal of the operational amplifier 240. One end of the second resistor Rb is coupled to the negative input end of the operational amplifier 240, and the other one of the second resistor Rb is coupled to an output terminal of the operational amplifier 240. One end of the third resistor Rc is coupled to the output terminal of the first digital-to-analog converter 220, and the other one of the third resistor Rc is coupled to a positive input terminal of the operational amplifier 240. One end of the fourth resistor Rd is coupled to the positive input terminal of the operational amplifier 240, and the other one of the fourth resistor Rd is applied with a reference voltage $V_{REF}$, wherein the voltage level of the reference voltage $V_{REF}$ can be the same as that of the ground voltage. Herein, it is assumed that the resistances of the first resistor Ra, the second resistor Rb, the third resistor Rc, and the fourth resistor Rd are identical. Accordingly, the circuit formed by the operational amplifier OP1 and the resistors Ra, Rb, Rc, and Rd can be viewed as an analog subtractor, and the second output voltage $V_{OUT}$ outputted by the operational amplifier 240 can be equal to the voltage obtained by subtracting the offset voltage $\Delta V$ from the first output voltage $V_{DAC}$.

In other words, the channel buffer 230 shifts the voltage level of the first output voltage by an offset voltage $\Delta V$, and outputs it to serve as the second output voltage $V_{OUT}$. The second output voltage $V_{OUT}$ is outputted to serve as the driving voltage to drive the liquid crystals to display corresponding brightness of gray levels. Accordingly, when the voltage levels of the common voltages of the different pixels (or sub-pixels) are different, the voltage level of the second output voltage $V_{OUT}$ can be adjusted according to the offset voltage $\Delta V$, so that the brightness displayed by the different pixels at the same gray level display are similar, and even the same.

Furthermore, because the shift reference of the gamma voltage can refer to the higher common voltage or the lower common voltage in two pixels, the offset voltage $\Delta V$ may be a negative voltage or a positive voltage, correspondingly. When the offset voltage $\Delta V$ is the negative voltage, the second output voltage $V_{OUT}$ is greater than the first output voltage $V_{DAC}$. When the offset voltage $\Delta V$ is the positive voltage, the second output voltage $V_{OUT}$ is less than the first output voltage $V_{DAC}$.

In the present embodiment, the offset voltage $\Delta V$ is provided by the second digital-to-analog converter 250, but in other embodiments it can be provided by an external circuit, and the invention is not limited thereto. For example, in an embodiment of the present invention, the offset voltage $\Delta V$ is an analog voltage and dynamically generated by a timing controller (TCON) of a display having the first resistor string 210, the first digital-to-analog converter 220 and the channel buffer 230.

In the present embodiment, the second digital-to-analog converter 250 includes a second resistor string 252 and a plurality of switches $SW_1$-$SW_N$, wherein N is a positive integer. The second resistor string 252 includes a plurality of resistors RV_1 to RV_N connected in series. The first end C of the first resistor string 252 is applied with a first input voltage $\Delta V_{REF\_H}$, and the second end D of the first resistor string 152 is applied with a second input voltage $\Delta V_{REF\_L}$, wherein the first input voltage $\Delta V_{REF\_H}$ is greater than the second input voltage $\Delta V_{REF\_L}$.

The resistors RV_1 to RV_N divide the voltage between the first input voltage $\Delta V_{REF\_H}$ and the second input voltage $\Delta V_{REF\_L}$ to provide a plurality of divided voltages $\Delta V_1$ to $\Delta V_N$. The switches $SW_1$-$SW_N$ are respectively applied with the divided voltages $\Delta V_1$ to $\Delta V_N$, and selects one of the divided voltage $\Delta V_1$ to $\Delta V_N$ as the offset voltage $\Delta V$ according to the control code CB. Accordingly, the second digital-to-analog converter 250 outputs the offset voltage $\Delta V$ according to the control code CB, wherein the bit number of the control code CB may be the same as the number of the switches $SW_1$-$SW_N$ to use each bit of the control code CB to control the switches $SW_1$-$SW_N$, respectively.

Moreover, the source driver shown in FIG. 2 has six bits, i.e. the number of the resistors of the first resistor string 210 is $2^6$. If the source driver having eight bits is required and has been changed, the number of the resistors of the first resistor string 210 is correspondingly increased to 256, i.e. $2^8$. Accordingly, the source driver having other number of the bits can be obtained in the same manner.

Second Embodiment

Figure 3:
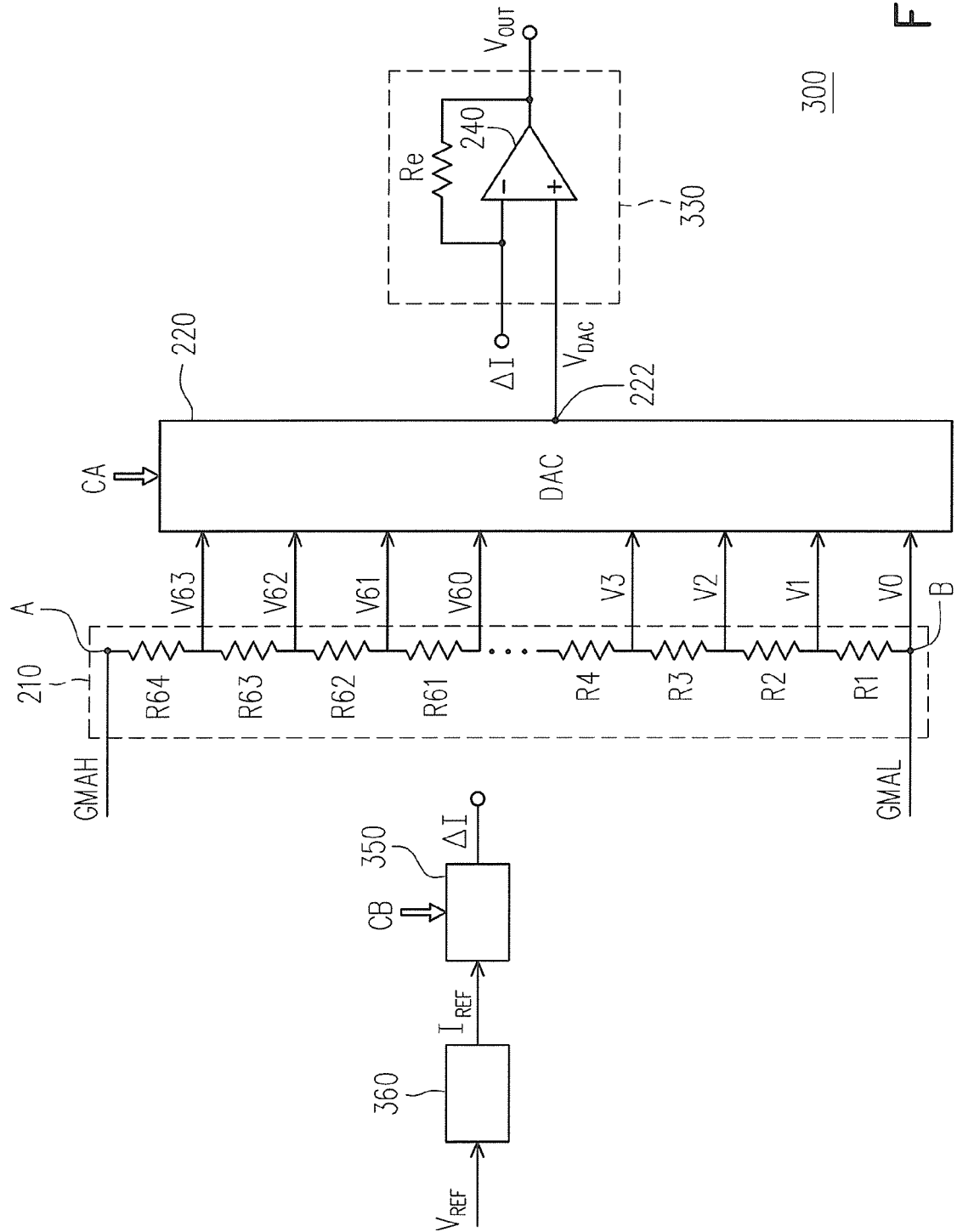
FIG. 3 is a circuit diagram of a source driver according to the second embodiment of the invention.

FIG. 3 is a circuit diagram of a source driver according to the second embodiment of the invention. Referring to FIG. 2 and FIG. 3, the differences thereof are the channel buffer 330, the current digital-to-analog converter 350, and the voltage-to-current converter 360. The channel buffer 330 shifts the first output voltage $V_{DAC}$ according to an offset current $\Delta I$. The channel buffer 330 includes the operational amplifier 240 and a resistor Re. One end of the resistor Re is coupled to the negative input terminal of the operational amplifier 240 and receives the offset current $\Delta I$, and the other one of the resistor Re is coupled to the output terminal of the operational amplifier 240 and outputs the second output voltage $V_{OUT}$. The positive input terminal of the operational amplifier 240 is coupled to the output terminal 222 of the first digital-to-analog converter 220 to be applied with the first output voltage $V_{DAC}$.

According to the circuit operation of the operational amplifier, the voltage level of the negative input terminal of the operational amplifier 240 is equal to that of the positive input terminal thereof. That is, the voltage level of the negative input terminal of the operational amplifier 240 is substantially equal to the first output voltage $V_{DAC}$. Furthermore, the offset current $\Delta I$ flows through the resistor Re so as to generate a voltage drop, and thus, the second output voltage $V_{OUT}$ outputted by the operational amplifier 240 is equal to the voltage obtained by subtracting the product of the resistor Re and the offset current $\Delta I$ from the first output voltage $V_{DAC}$ (i.e. $V_{DAC}-\Delta I \times Re$) Accordingly, when the offset current $\Delta I$ is changed, the second output voltage $V_{OUT}$ is also changed with it.

In the present embodiment, the offset current $\Delta I$ is provided by the current digital-to-analog converter 350, but in other embodiments it can be provided by an external circuit, and the invention is not limited thereto. The current digital-to-analog converter 350 converts a reference current $I_{REF}$ into the offset current $\Delta I$ according to the control code CB, and outputs the offset current $\Delta I$ to the channel buffer 330, wherein the control code CB of the present embodiment may be the same as or different from that of the foregoing embodiment. Furthermore, in the present embodiment, the reference current $I_{REF}$ is provided by the voltage-to-current converter 360, but in other embodiments it can be provided by an external circuit, and the invention is not limited thereto. The voltage-to-current converter 360 converts the reference voltage $V_{REF}$ into the reference current $I_{REF}$, wherein the voltage-to-current converter 360 can be a resistor.

To sum up, the source driver in the embodiment of the invention can select the size of the offset voltage according to the control code, and shift the voltage level of the second outputted voltage according to the offset voltage to adjust the display effect of the liquid crystal. Moreover, the source driver in the embodiment of the invention can generate the offset current according to the control code, and shift the voltage level of the second outputted voltage according to the offset current to adjust the display effect of the liquid crystal. Accordingly, through the shift of the second output voltage, the pixels having different common voltages can display the similar or the same effect. Furthermore, by using a channel buffer, the voltage level of the driving voltage is shifted to simplify the complexity of the circuit design. Moreover, the phenomenon of crosstalk of the display could be avoided by shifting the gamma voltages by the proper voltage offsets within corresponding scanning periods of the display. In addition, since the single operational amplifier 240 is used to shift the gamma voltages, the phenomenon of OP deviation of the channel buffer 230 or 330 is eliminated.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A source driver, comprising:
    a first resistor string, comprising a plurality of resistors connected in series, each of the resistors of the first resistor string providing a corresponding gamma voltage;
    a first digital-to-analog converter, coupled to the resistors of the first resistor string, wherein the first digital-to-analog converter outputs one of gamma voltages provided by the resistors as a first output voltage according to a data code;
    a channel buffer, coupled to an output terminal of the first digital-to-analog converter, shifting a voltage level of the first output voltage by an offset voltage so as to output a second output voltage; and
    a second digital-to-analog converter for outputting the offset voltage according to a control code.

2. The source driver as claimed in claim 1, wherein the channel buffer comprises:
    an operational amplifier, outputting the second output voltage;
    a first resistor, one of two ends of the first resistor being applied with the offset voltage, and the other one of the two ends of the first resistor being coupled to a negative input terminal of the operational amplifier;
    a second resistor, one of two ends of the second resistor being coupled to the negative input end of the operational amplifier, and the other one of the two ends of the second resistor being coupled to an output terminal of the operational amplifier;
    a third resistor, one of two ends of the third resistor being coupled to the output terminal of the first digital-toanalog converter, and the other one of the two ends of the third resistor being coupled to a positive input terminal of the operational amplifier; and a fourth resistor, one of the two ends of the fourth resistor being coupled to the positive input terminal of the operational amplifier, and the other one of the two ends of the fourth resistor being applied with a reference voltage.

3. The source driver as claimed in claim 2, wherein the resistances of the first resistor, the second resistor, the third resistor, and the fourth resistor are identical.

4. The source driver as claimed in claim 1, wherein the second digital-to-analog converter comprises:

a second resistor string, comprising a plurality of resistors connected in series, each of the resistors of the second resistor string providing a corresponding divided voltage; and a plurality of switches, selecting one of the divided voltage as the offset voltage according to the control code.

5. The source driver as claimed in claim 4, wherein a first end of the second resistor string is applied with a first input voltage, a second end of the second resistor string is applied with a second input voltage, and the first input voltage is greater than the second input voltage.

6. The source driver as claimed in claim 1, wherein a first end of the first resistor string is applied with a first reference voltage, a second end of the first resistor string is applied with a second reference voltage, and the first reference voltage is greater than the second reference voltage.

7. A source driver, comprising:

a current digital-to-analog converter, outputting an offset current according to a control code;

a first resistor string, comprising a plurality of resistors connected in series, each of the resistors of the first resistor string providing a corresponding gamma voltage;

a first digital-to-analog converter, coupled to the resistors of the first resistor string, wherein the first digital-to-analog converter outputs one of gamma voltages provided by the resistors as a first output voltage according to a data code; and a channel buffer, coupled to an output terminal of the first digital-to-analog converter, shifting a voltage level of the first output voltage by an offset voltage so as to output a second output voltage, the channel buffer comprising:

an operational amplifier, outputting the second output voltage, wherein a positive input terminal of the operational amplifier is coupled to the output terminal of the first digital-to-analog converter; and a resistor, wherein one of two ends of the resistor is coupled to a negative input terminal of the operational amplifier and receives the offset current, and the other one of the two ends of the resistor is coupled to an output terminal of the operational amplifier and outputs the second output voltage.

8. The source driver as claimed in claim 7, further comprising a voltage-to-current converter, wherein the voltage-to-current converter converts a reference voltage into a reference current, and the current digital-to-analog converter outputs the offset current based on the reference current.

9. The source driver as claimed in claim 8, wherein the voltage-to-current converter is a resistor.

10. The source driver as claimed in claim 1, wherein the second output voltage is less than the first output voltage.

11. The source driver as claimed in claim 1, wherein the second output voltage is greater than the first output voltage.

12. The source driver as claimed in claim 7, wherein a first end of the first resistor string is applied with a first reference voltage, a second end of the first resistor string is applied with a second reference voltage, and the first reference voltage is greater than the second reference voltage.

13. The source driver as claimed in claim 7, wherein the second output voltage is less than the first output voltage.

14. The source driver as claimed in claim 7, wherein the second output voltage is greater than the first output voltage.

* * * * *